(12) United States Patent
Michael et al.

(10) Patent No.: US 7,391,226 B2
(45) Date of Patent: Jun. 24, 2008

(54) CONTACT RESISTANCE TEST STRUCTURE AND METHODS OF USING SAME

(75) Inventors: Mark W. Michael, Cedar Park, TX (US); Raymond G. Stephany, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/421,217

(22) Filed: May 31, 2006

(65) Prior Publication Data

US 2007/0279064 A1 Dec. 6, 2007

(51) Int. Cl.
*G01R 27/08* (2006.01)
*G01R 31/26* (2006.01)
*H01L 29/10* (2006.01)

(52) U.S. Cl. .................. 324/713; 324/719; 324/421; 257/48

(58) Field of Classification Search .......... None
See application file for complete search history.

(56) References Cited

U.S. PATENT DOCUMENTS

| | | | | |
|---|---|---|---|---|
| 6,379,978 B2 * | 4/2002 | Goebel et al. ............... 438/3 |
| 6,559,475 B1 * | 5/2003 | Kim ........................... 257/48 |
| 6,563,320 B1 * | 5/2003 | Look et al. .................. 324/512 |
| 7,157,927 B2 * | 1/2007 | Okajima ..................... 324/765 |
| 2002/0179962 A1 * | 12/2002 | Kinoshita ................... 257/315 |
| 2003/0006795 A1 * | 1/2003 | Asayama et al. ............ 324/763 |
| 2003/0030456 A1 * | 2/2003 | Nanba ........................ 324/754 |

OTHER PUBLICATIONS

Rabaey et al., Digital Integrated Circuits, 2003, Prentice Hall, Second Edition, p. 48.*

* cited by examiner

*Primary Examiner*—Diego Gutierrez
*Assistant Examiner*—Jeff Natalini
(74) *Attorney, Agent, or Firm*—Williams, Morgan & Amerson, P.C.

(57) ABSTRACT

The present invention is directed to a contact resistance test structure and methods of using same. In one illustrative embodiment, the method includes forming a test structure comprised of two gate electrode structures, forming a plurality of conductive contacts to a doped region between the two gate electrode structures, forcing a current through the test structure and determining a resistance of at least one of the conductive contacts based upon, in part, the forced current.

21 Claims, 5 Drawing Sheets

CONTACT RESISTANCE TEST STRUCTURE AND METHODS OF USING SAME

BACKGROUND OF THE INVENTION

1. Field of the Invention

The present invention is generally directed to the field of semiconductor devices, and, more particularly, to a contact resistance test structure and methods of using same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such tran-sistors.

FIG. 1A is a cross-sectional view of an illustrative transistor 10 formed above a semiconducting substrate 12. The transistor 10 is generally comprised of a gate electrode 14, a gate insulation layer 16, source/drain regions 20 and a sidewall spacer 22. An illustrative trench isolation structure 18 is formed in the substrate 12 to electrically isolate the transistor 10 from adjacent semiconductor devices, e.g., other transistors. Conductive contacts 26 are formed in a layer of insulating material 24. The contacts 26 are the means by which a conductive electrical path is established with the source/drain regions 20. The illustrative transistor 10 depicted in FIG. 1A may be formed in accordance with various techniques that are well known to those skilled in the art.

It should be understood that the transistor 10 in FIG. 1A is depicted in an ideal state that may or may not correspond to devices that have actually been manufactured using a variety of complex process flows. More specifically, in FIG. 1A, the entirety of the contact area 25 of the contact 26 engages the source/drain region 20. However, as device dimensions have continued to shrink, it is becoming increasingly difficult to insure that the entirety of the contact area 25 contacts the desired region, i.e., the source/drain region 20. Additionally, due to device size reductions and increased density, it is becoming more difficult to precisely align one structure, e.g., the contact 26, with the desired contact region, e.g., the source/drain region 20, without interfering with other structures.

For example, FIG. 1B depicts an illustrative example wherein the contacts 26 are at least partially formed on the sidewall spacer 22 of the transistor 10. In this illustrative situation, the contact area 25A is less than the idealized or theoretical contact area 25 shown in FIG. 1A. Accordingly, the contact resistance will increase in proportion to the size of the contact area 25 relative to the contact area 25A. FIG. 1C depicts another illustrative example in which a plurality of gate electrode structures share a common active region, e.g., a doped source/drain region 20. Similar to the situation depicted in FIG. 1B, the contact area 25A of the contacts 26 in FIG. 1C is less than the idealized or theoretical contact area 25 shown in FIG. 1A. In the particular example depicted in FIG. 1C, the close positioning of the gate electrode structures 14 and the size of the spacer 22 leave very little room, e.g., 10-100 nm, between the spacer 22 on adjacent devices. Such densely packed structures make it difficult to manufacture devices in which the entire area 25 fully engages the desired contact regions, i.e., a source/drain region. Such variations in contact resistance in actual devices as compared to contact resistance determined from an assumption that the contacts 26 fully contact the desired area (as shown in FIG. 1A) may lead to device performance that is less than anticipated or desired.

The present invention is directed to various methods and systems that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a contact resistance test structure and methods of using same. In one illustrative embodiment, the method comprises forming a test structure comprised of two gate electrode structures, forming a plurality of conductive contacts to a doped region between the two gate electrode structures, forcing a current through the test structure and determining a resistance of at least one of the conductive contacts based upon, in part, the forced current.

In another illustrative embodiment, the method comprises forming a test structure comprised of two gate electrode structures, each of the gate electrode structures comprising at least one sidewall spacer, wherein the two gate electrode structures of the test structure are formed at the same time as gate electrode structures are formed for an integrated circuit device that is formed on a common substrate with the test structure. The method further comprises forming a plurality of conductive contacts to a doped region between the two gate electrode structures, forcing a current through the test structure and determining a resistance of at least one of the conductive contacts based upon, in part, the forced current.

In yet another illustrative embodiment, the method comprises forming a test structure comprised of two gate electrode structures, each of the gate electrode structures comprising at least one sidewall spacer, and first, second and third conductive contacts which are conductively coupled to a doped region between said two gate electrode structures. The method further comprises forcing a current through the second conductive contact and the first conductive contact, detecting a voltage differential between the second and third conductive contacts and determining a resistance of the second conductive contact based upon the forced current and the detected voltage.

BRIEF DESCRIPTION OF THE DRAWINGS

The invention may be understood by reference to the following description taken in conjunction with the accompanying drawings, in which like reference numerals identify like elements, and in which.

Figure 1A:
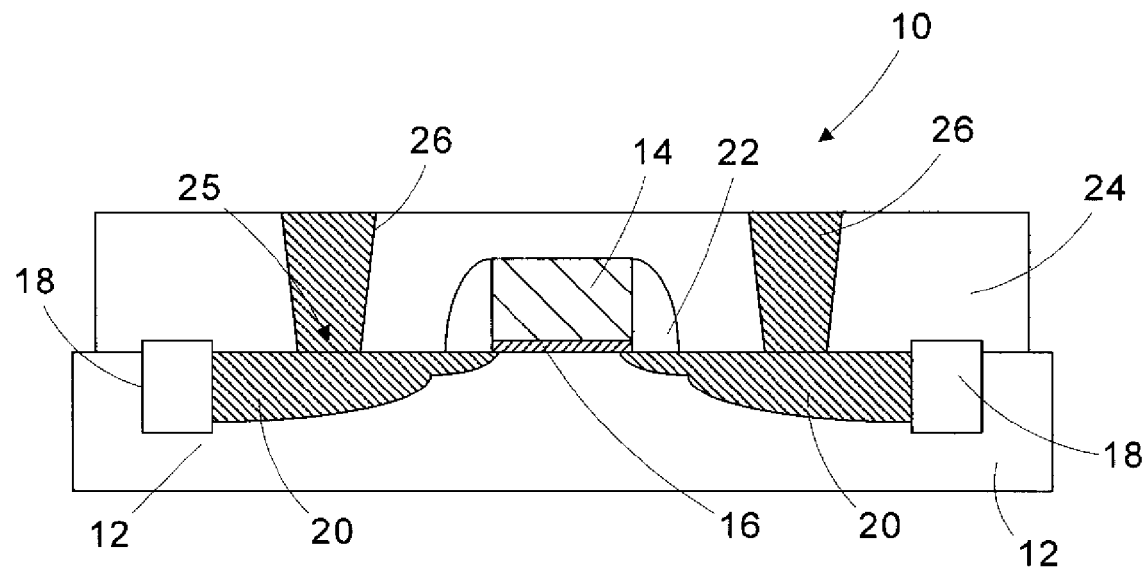
FIGS. 1A-1C are illustrative prior art devices depicting problems encountered in the formation of conductive contacts to various active regions.
Figure 1B:
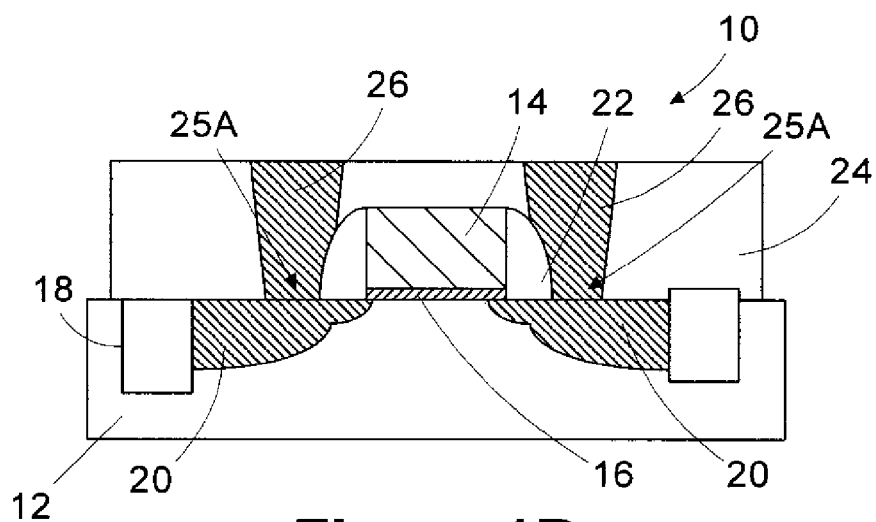
Figure 1C:
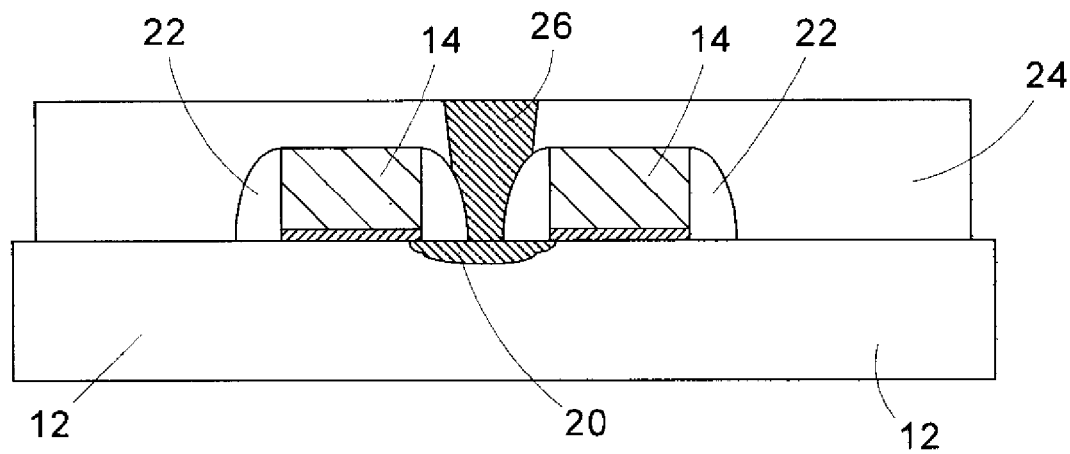

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2:
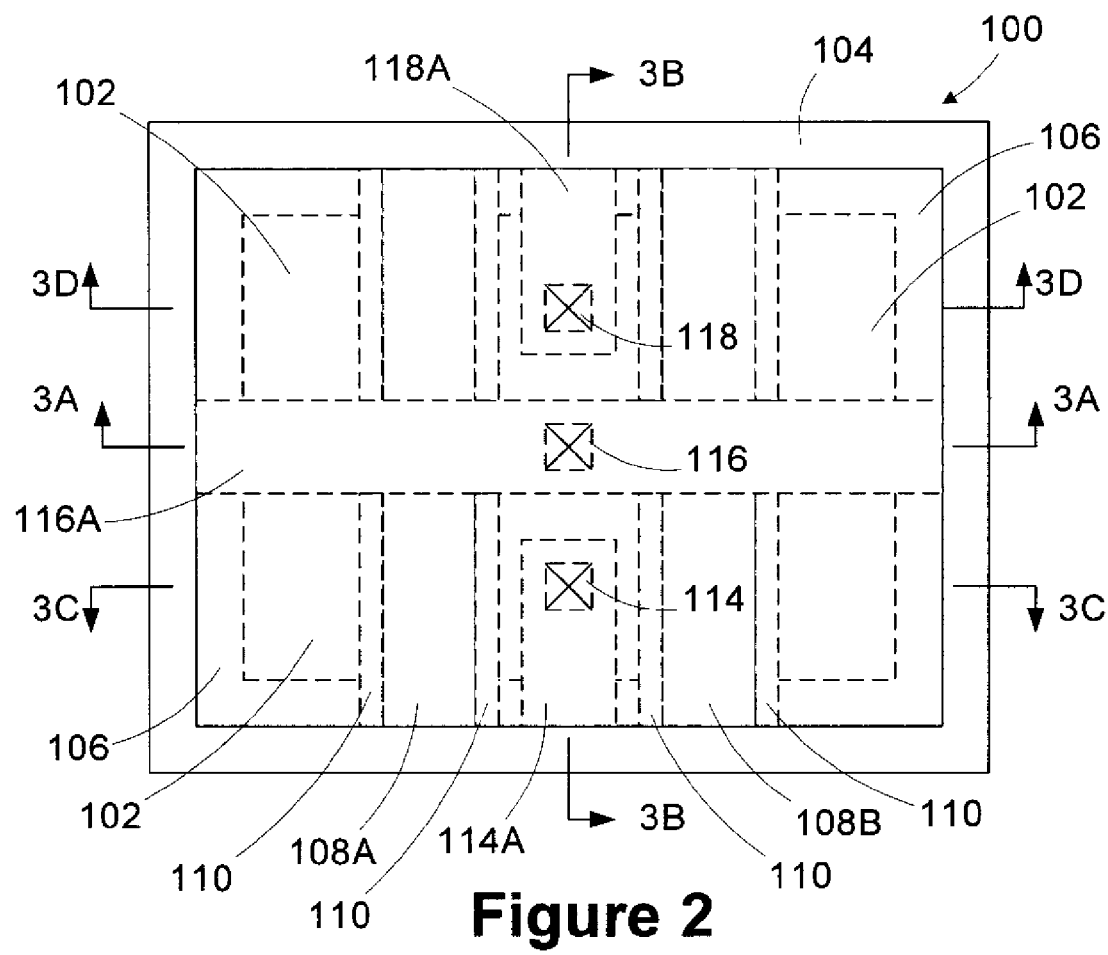
FIG. 2 is a top view of an illustrative contact resistance test structure in accordance with one aspect of the present invention.
Figure 3A:
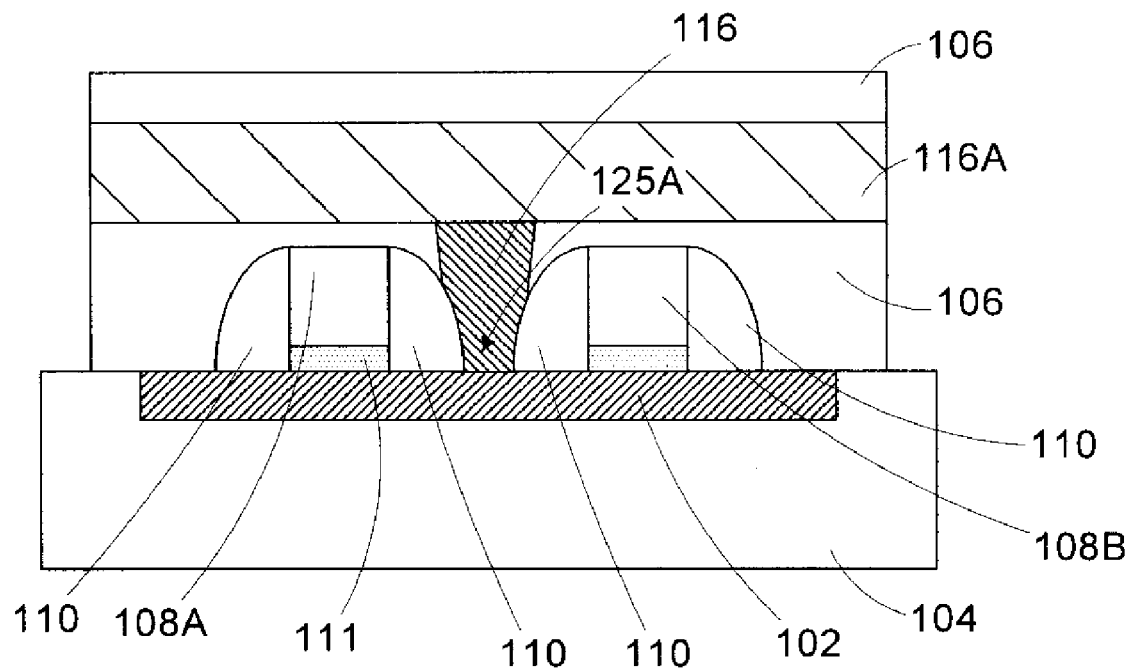
FIGS. 3A-3D are cross-sectional views of the illustrative test structure depicted in FIG. 2.
Figure 3B:
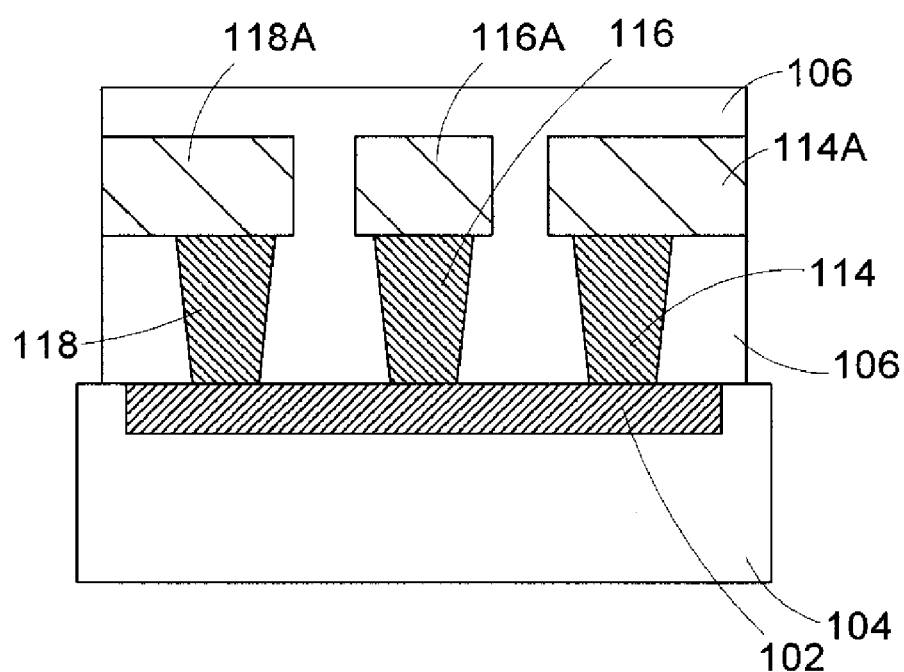
Figure 3C:
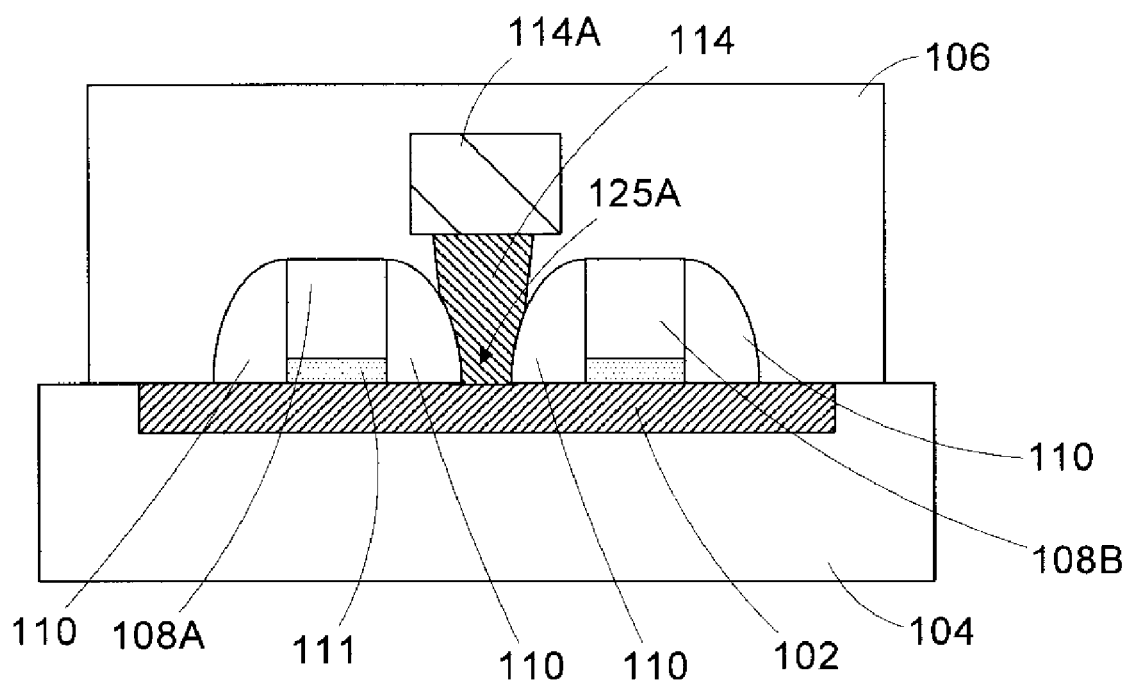
Figure 3D:
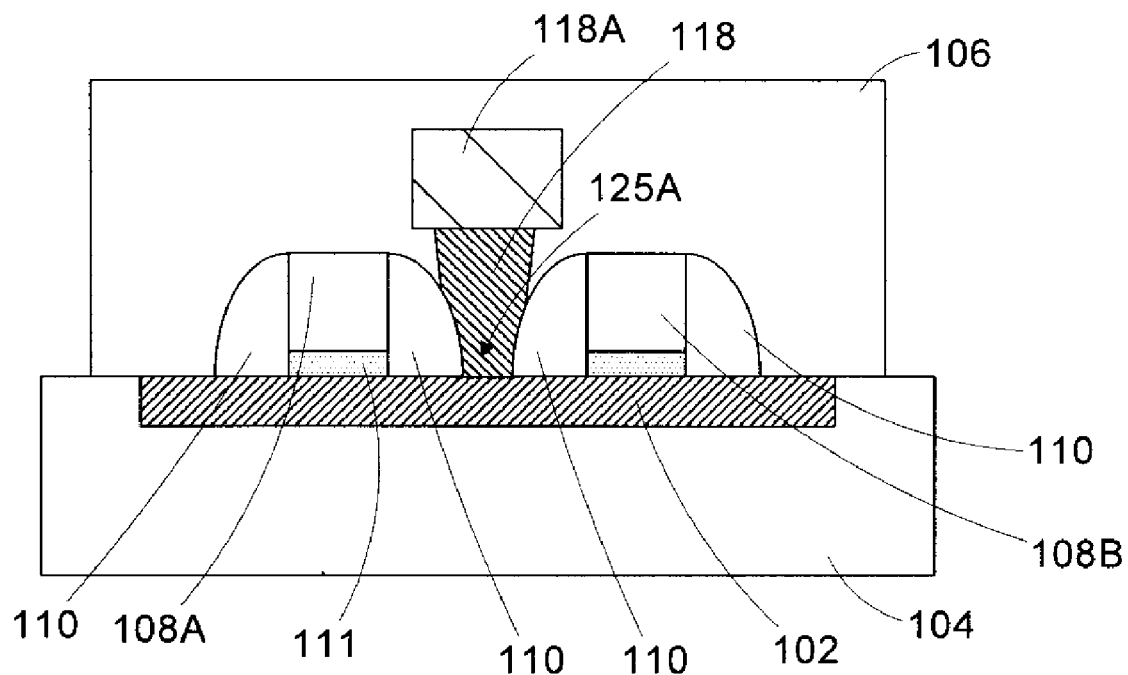
Figure 4:
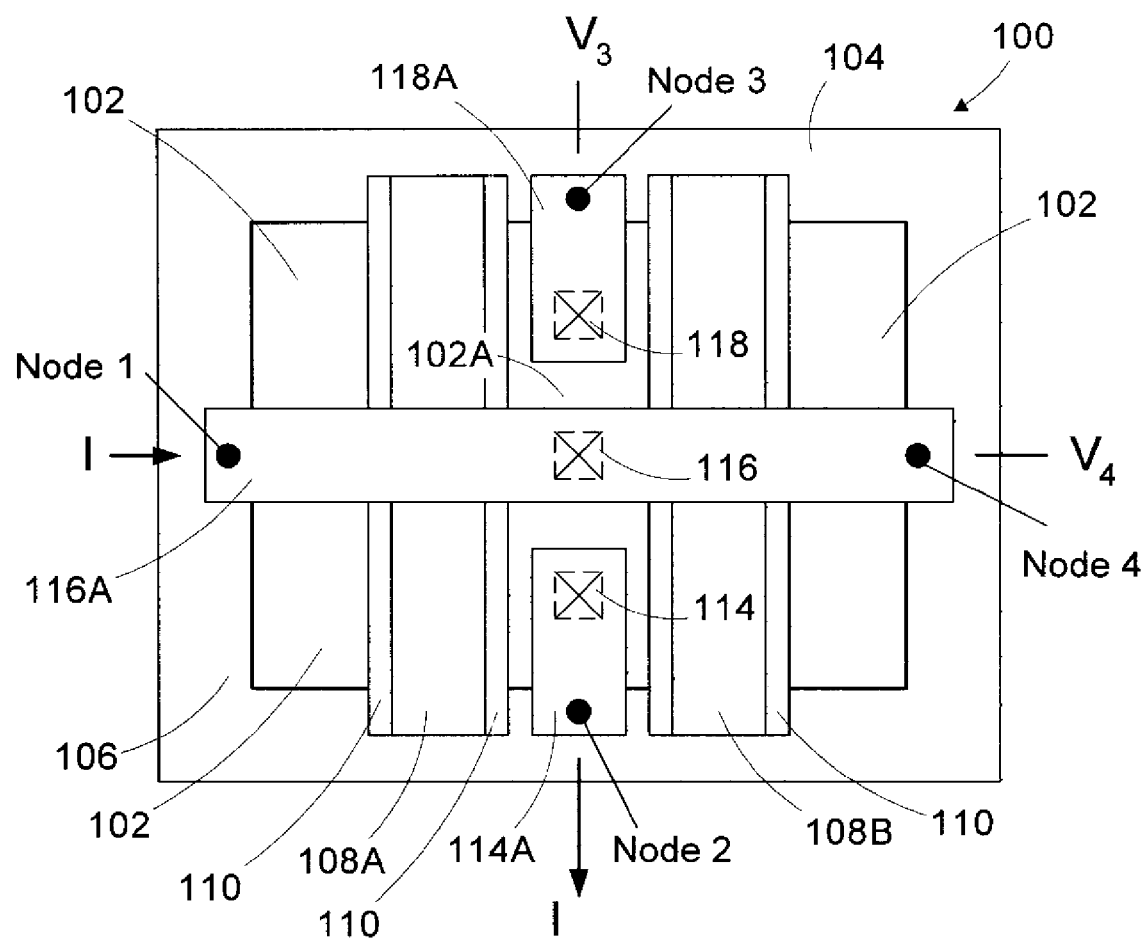
FIG. 4 is the structure depicted in FIG. 2 with the layer of insulating material removed for clarity.

The present invention is directed to a contact resistance test structure 100 that will enable engineers to more accurately determine contact resistance levels on real-world devices. FIG. 2 is a top view of the illustrative test structure 100 disclosed herein, while FIGS. 3A-3D are cross-sectional side views taken along the lines indicated in FIG. 2. FIG. 4 is the structure depicted in FIG. 2 with the layer of insulating material removed for purposes of clarity. Any desired number of test structures 100 may be formed on a semiconducting substrate, and they may be formed in the scribe lines of the semiconducting substrate or in some portion of a production die.

With reference to FIG. 2 and FIGS. 3A-3D, the test structure 100 generally comprises an active area 102 formed in a semiconducting substrate 104. A plurality of features 108A, 108B are formed above the substrate 104. A sidewall spacer 110 is formed adjacent the features 108A, 108B. In one illustrative embodiment, the features 108A, 108B are gate electrode structures. Such features may also include an illustrative gate insulation layer 111. The test structure 100 further comprises a plurality of active area contacts 114, 116 and 118. The contacts 114, 116 and 118 are electrically coupled to associated conductive lines 114A, 116A and 118A.

In general, the test structure 100 may be formed using a variety of process techniques. For example, the active area 102 is a doped region of the substrate 104 that may be formed by performing one or more ion implant or diffusion processes. The active area 102 may be formed such that it accurately represents existing active areas, e.g., source/drain regions, on real-world devices. Similarly, the features 108A, 108B may be formed using a variety of techniques. In one particularly illustrative application of the present invention, the features 108A, 108B are gate electrode structures that approximately correspond to the gate electrode structures formed on actual production devices. The gate electrode and gate insulation layer 111 may be formed by performing known deposition processes, thermal growth processes and etching processes. It should be understood that the illustrative spacer 110 depicted in FIG. 3A is depicted by way of example only. There may actually be two or more spacers 110 formed adjacent the structures 108A, 108B. Thus, the particular composition and size of the structures 108A, 108B and the spacer 110 should not be considered a limitation. The conductive line 116A is coupled to the contact 116. In FIG. 3B, the various conductive lines 114A, 116A and 118A are depicted. The manner in which such conductive lines are formed is well known to those skilled in the art.

In general, the test structure 100 may be comprised of structures 108A, 108B, e.g., gate electrode structures, that more accurately reflect the situation encountered on production devices. To that end, the illustrative contact 116 show in FIG. 3A has a contact area 125A that is less than the theoretical contact area 25 depicted in FIG. 1A. More specifically, due to the limited spacing between the spacers 110 and/or less than perfect alignment processes, the contact 116 does not fully contact the underlying active area 102. FIGS. 3C and 3D depict the same situation for the contacts 114 and 118, respectively.

In one illustrative embodiment, a current may be applied to the test structure 100 disclosed herein to determine the resistance of the contact 116. This determined resistance better reflects the resistance of the actual fabricated devices since it incorporates similar structures to those employed in the actual devices. More specifically, the gate structures, spacers and contacts in the test structure 100 are formed using the same process flow used to form such features on actual production devices. Once the resistance of the contact 116 is determined, it may be compared to the design value of the resistance for such contact structures on actual devices. Information that more accurately reflects the actual resistance of real-world devices can be useful to circuit designers in designing future devices and/or compensating for changes in the resistance value for such contacts relative to a design or anticipated resistance value for such contacts.

More specifically, as indicated in FIG. 4, the structure 100 may be understood to comprise four nodes (Node 1, Node 2, Node 3, Node 4). The portion of the active area 102 between the structures 108A and 108B will be referred to by the reference number 102A. In one illustrative example, a current source (not shown) may be used to force a known current (I) from Node 1 to Node 2. The current (I) will flow from Node 1, through line 116A, down contact 116, into region 102A, up through contact 114, and down line 114A to Node 2. The magnitude of the current (I) may vary depending upon the particular application. In one illustrative embodiment, the current (I) may vary from 100 microamps to 10 milliamps.

Thereafter, the relative voltage ($\Delta V_{3-4}$) between Node 3 and Node 4 is determined. This relative voltage may be measured directly between Nodes 3 and 4, or the voltage at each of Nodes 3 and 4 may be measured relative to ground and compared on that basis. With the relative voltage ($\Delta V_{3-4}$) determined, and the current (I) being known, the resistance (R) of the contact 116 may be readily determined by Ohm's law (R=V/I).

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a test structure comprised of a semiconducting substrate and two transistor gate electrode structures formed above said semiconducting substrate;
    forming a doped region within said semiconducting substrate and between said two gate electrode structures;
    forming a plurality of conductive contacts to said doped region;
    forcing a current through said test structure; and
    determining a resistance of at least one of said conductive contacts based upon, in part, said forced current.

2. The method of claim 1, wherein said two gate electrode structures are comprised of polysilicon.

3. The method of claim 1, wherein each of said gate electrode structures comprises at least one sidewall spacer.

4. The method of claim 1, wherein said two gate electrode structures of said test structure are formed at the same time as gate electrode structures are formed for an integrated circuit device that is formed on a common substrate with said test structure.

5. The method of claim 4, wherein said two gate electrode structures of said test structure and said gate electrode structures of said integrated circuit device are formed using the same process flow.

6. The method of claim 1, wherein said gate electrode structures are spaced apart by a distance of between 10-200 nm.

7. The method of claim 1, wherein forcing a current through said test structure comprises forcing a current through said test structure using a current source.

8. The method of claim 1, wherein determining a resistance of at least one of said conductive contacts based upon, in part, said forced current comprises detecting a voltage across said at least one contact and dividing said detected voltage across said at least one contact by said current.

9. The method of claim 1, further comprising comparing said determined resistance to a design resistance value.

10. The method of claim 1, wherein said test structure comprises at least first, second and third conductive contacts, each of which are conductively coupled to said doped region and each of which are coupled to a separate conductive line, the method further comprising:
    forcing a current through said second conductive contact and said first conductive contact; and
    detecting a voltage differential between said second and third conductive contacts.

11. A method, comprising:
    forming a test structure comprised of a semiconducting substrate and two transistor gate electrode structures formed above said semiconducting substrate, each of said gate electrode structures comprising at least one sidewall spacer, wherein said two gate electrode structures of said test structure are formed at the same time as gate electrode structures are formed for an integrated circuit device that is formed on a common substrate with said test structure;
    forming a doped region within said semiconducting substrate and between said two gate electrode structures;
    forming a plurality of conductive contacts to said doped region;
    forcing a current through said test structure; and
    determining a resistance of at least one of said conductive contacts based upon, in part, said forced current.

12. The method of claim 11, further comprising comparing said determined resistance to a design resistance value.

13. The method of claim 11, wherein said two gate electrode structures of said test structure and said gate electrode structures of said integrated circuit device are formed using the same process flow.

14. The method of claim 11, wherein forcing a current through said test structure comprises forcing a current through said test structure using a current source.

15. The method of claim 11, wherein determining a resistance of at least one of said conductive contacts based upon, in part, said forced current comprises detecting a voltage across said at least one contact and dividing said detected voltage across said at least one contact by said current.

16. The method of claim 11, wherein said test structure comprises at least first, second and third conductive contacts, each of which are conductively coupled to said doped region and each of which are coupled to a separate conductive line, the method further comprising:
    forcing a current through said second conductive contact and said first conductive contact; and
    detecting a voltage differential between said second and third conductive contacts.

17. A method, comprising:
    forming a test structure comprised of:
        a semiconducting substrate;
        two transistor gate electrode structures formed above said semiconducting substrate, each of said gate electrode structures comprising at least one sidewall spacer;
        a doped region within said semiconducting substrate and between said two gate electrode structures; and
        first, second and third conductive contacts which are conductively coupled to said doped region;
    forcing a current through said second conductive contact and said first conductive contact;
    detecting a voltage differential between said second and third conductive contacts; and
    determining a resistance of said second conductive contact based upon said forced current and said detected voltage.

18. The method of claim 17, wherein said two gate electrode structures of said test structure are formed at the same time as gate electrode structures are for an integrated circuit device that is formed on a common substrate with said test structure.

19. The method of claim 18, wherein said two gate electrode structures of said test structure and said gate electrode structures of said integrated circuit device are formed using the same process flow.

20. The method of claim 17, wherein forcing a current through said test structure comprises forcing a current through said test structure using a current source.

21. The method of claim 17, further comprising comparing said determined resistance to a design resistance value.

* * * * *